Nov. 15, 1966 K. KATZ 3,285,786

COEXTRUDED THERMOELECTRIC MEMBERS

Filed Jan. 5, 1961 4 Sheets-Sheet 1

WITNESSES

Edwin E. Bassler

Raymond J. Majesko

INVENTOR

Kurt Katz

BY

Frederick Shapoe

ATTORNEY 3,285,786

COEXTRUDED THERMOELECTRIC MEMBERS

Kurt Katz, Pittsburgh, Pa., assignor to Westinghouse Electric Corporation, East Pittsburgh, Pa., a corporation of Pennsylvania Filed Jan. 5, 1961, Ser. No. 80,914

12 Claims. (Cl. 136—205)

The present invention relates to extruded thermoelectric elements and process for producing the same.

In producing thermoelectric devices one of the most difficult problems is the application of good electrical contacts to a body of the thermoelectric material proper. The thermoelectric materials for both cooling and power generation applications are almost always comprised of semi-conductor or ceramic-like materials. It is critically necessary that the electrical contacts which are metallic, be bonded to the thermoelectric material almost perfectly so that the lowest possible electrical drop occurs therebetween. Also the contact member must be so mechanically or physically joined that it will not loosen or become detached during service condition when substantial temperature differences prevail in the devices. Those skilled in the art will appreciate the extreme difficulties in soldering, brazing or otherwise joining a metallic contact to a semiconductor or ceramic material, the latter often being brittle, to attain these desired objectives. A high percentage of defective or unsatisfactory devices occur routinely even in the best processes now in use. During service many failures may take place because of the gradual weakening or mechanical failure of the bond between the metallic contacts and the body of thermoelectric material.

The object of the present invention is to provide for concurrently consolidating a thermoelectric material into a thermoelectric body and to provide well bonded metal contacts thereto by extruding a billet comprising a metal jacket and a thermoelectric material under selected temperatures and pressures so as to produce an elongated thermoelectric element in which the metal jacket forms an electrical contact extremely well bonded to the highly consolidated body of thermoelectric material which will meet the requirement for optimum thermoelectric use.

A further object of the invention is to provide a process for extruding a billet comprising a metal jacket, at least one thermoelectric material disposed in the metal jacket and a central metal member under selected temperatures and pressures so as to produce an elongated thermoelectric element in which the extruded metal of the jacket forms one contact well bonded to one surface of a highly consolidated body of thermoelectric material and the extruded central metal member forms another contact well bonded to another surface of the consolidated body of thermoelectric material.

Another object of the present invention is to provide a process for fabricating a thermoelectric element comprising disposing a plurality of thermoelectric materials within a hollow cylindrical metal member having a plurality of compartments with metal partitions between the compartments, the ends of the cylindrical metal member being sealed, and extruding the assembly through a die to provide a highly compacted member comprising consolidated layers of thermoelectric material in firm and intimate contact with the metal walls of the extruded metal cylindrical and partition members.

Another object of the invention is to provide an extruded thermoelectric element comprising an exterior hollow cylindrical metal member, metal members disposed within the hollow of the cylindrical member and cooperating to form compartments within the hollow member and at least one thermoelectric material disposed in the compartments, the thermoelectric material being highly consolidated and in firm and intimate contact with the metal walls of the extruded metal members.

Other objects of the invention will, in part, be obvious and will, in part, appear hereinafter.

For a better understanding of the nature and scope of the invention, reference should be had to the following detailed description and drawings, in which.

Figure 1:
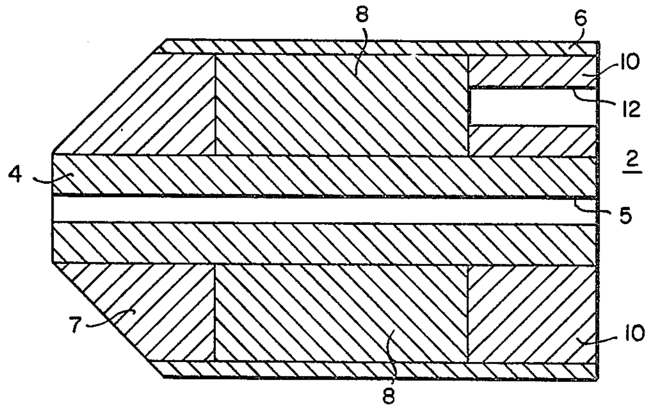
FIGURE 1 is an elevation view in cross section of a coextrusion billet in accordance with the teachings of the invention.

In accordance with the present invention thermoelectric material is concurrently consolidated into a body of desired shape and metal contacts are joined to surfaces of the body to produce a thermoelectric element by (1) introducing one or more thermoelectric materials into a hollow cylindrical metal member having at least one compartment therein formed by the inner walls of the cylindrical member and at least one metal partition member, in a preferred form of the invention the partition member being a centrally disposed cylindrical member, the thermoelectric materials being compacted into the compartments, (2) sealing the ends of the cylindrical member to produce an extrusion billet, (3) extruding the billet comprising the sealed cylindrical member under selected temperatures and pressures to effect a selected high reduction in area not exceeding about 60 to 1, whereby to produce an elongated thermoelectric element comprising a highly consolidated body of thermoelectric material with the extruded metal members in firm and intimate contact with the surfaces thereof. A preferred reduction ratio range is from about 15:1 to 60:1. A reduction ratio substantially in excess of 60:1 results in less satisfactory extruded members than at lower ratios due to uncontrollable distortion, waviness and other defects beginning to occur. The reduction ratio may be as low as 2 to 1 by employing suitable wetting agents such as a layer of a low melting point metal on the billet walls, between the thermoelectric material and the cladding material. The extruded member will be processed to cut off the ends, and may be severed into a plurality of cylindrical units which may be further machined, or severed into thermoelectric pellets, or joined to produce composite thermoelectric elements and assemblies which may be electrically connected, and suitably insulated, both electrically and thermally, into thermoelectric power generators or cooling devices.

When employing a compartmented metal member having more than one compartment, the thermoelectric material disposed in one compartment usually will be of a different composition than that disposed in an adjacent compartment or they may comprise basically the same thermoelectric material with different doping modifications. In the embodiment of the invention wherein concentric cylindrical metal members are employed to form therebetween a compartment, the inner or central cylindrical member may consist of a composite comprising concentrically bonded dissimilar metals. The central concentric cylindrical member may be solid or hollow.

In each embodiment of the invention, the volume delineated by the metal walls is completely filled with the thermoelectric material and will be compacted so as to fill the compartments. Then the ends of the metal members are applied, the thermoelectric material is outgassed and the ends are hermetically sealed to provide a closure.

It should be understood that the thermoelectric material or materials may be either cast or molded within the compartmented cylindrical metal member or may be disposed therein in the form of a compact or loosely as powder or flakes. In all cases, it is desirable that as high a density as is reasonably possible be secured.

Referring to FIG. 1, there is shown an extrusion billet 2 which is typical of that used to carry out the teaching of the invention. In this particular embodiment, the billet consists of a central cylindrical metal member 4 having a bore 5 disposed within a hollow cylindrical concentric metal member 6. A nose plug 7 is welded to the front end of the member 4 and metal member 6 to provide a volume or space. The volume between the concentric members 4 and 6 is filled with a thermoelectric material 8 and the material is compressed at a pressure of approximately 1,000 p.s.i. and higher. Pressures up to approximately 24 t.s.i. (tons per square inch) have been used with good results. The billet is sealed preferably by welding at its rear end a cap 10 containing an evacuation bore 12. The thermoelectric material 8 in the billet is then degassed through the evacuation bore 12 at an elevated temperature of, for example, from 600° F. to 1,000° F. for lead telluride, by applying a low pressure of 1 micron or less, for a period of from 16 to 24 hours for the purpose of removing gases and volatiles from the thermoelectric material. Otherwise materials may be degassed at lower temperatures or even at room temperature. Good outgassing is desirable. When outgassing is complete the evacuation bore 12 is sealed by inserting a cap and brazing or welding and the billet is thus ready for extrusion.

Figure 2:
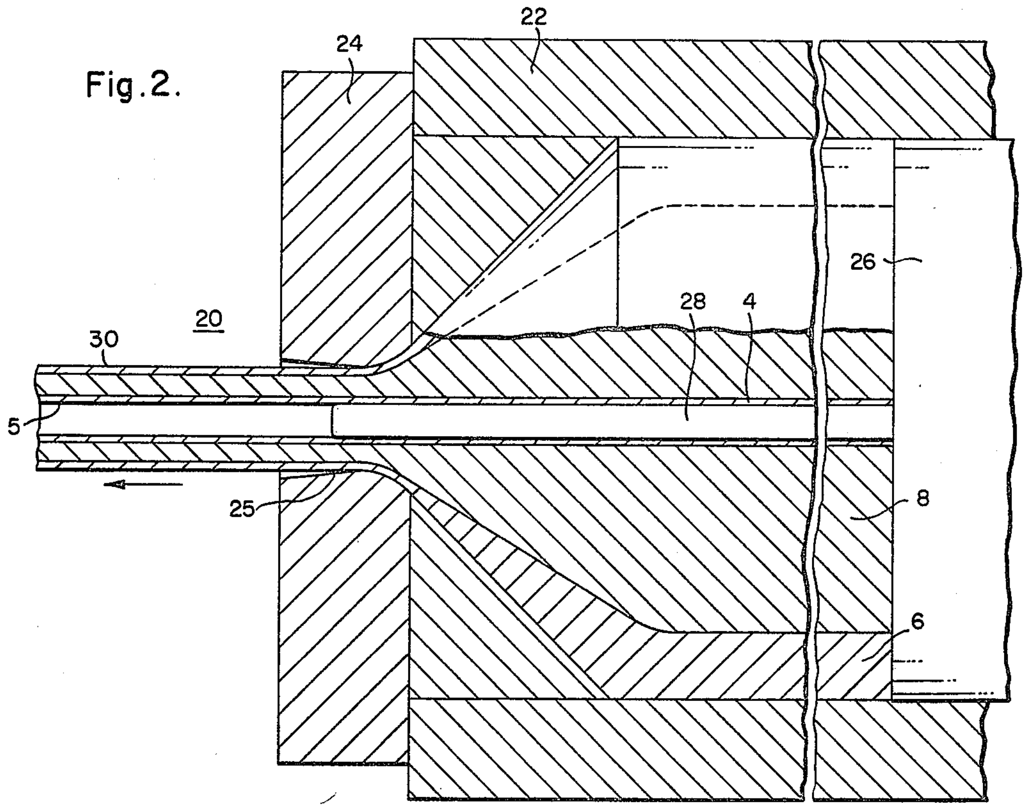
FIG. 2 is an elevation view in cross section of a thermoelectric element being extruded in accordance with the teachings of the invention.

Referring to FIG. 2, there is shown schematically a portion of an extrusion press 20 have a cylindrical liner 22 on which is mounted a die 24 and an extrusion cone 25, which facilitates extrusion. Disposed in the liner 22 is a ram 26 which has integrally secured thereto a punch 28 corresponding to the diameter of the bore 5 of the billet 2. In operation, the billet 2 is placed in the liner 22, then the ram 26 is positioned at the back end of the billet 2, with the punch 28 fitted within the hollow bore 5. If a solid rod 4 is employed, the punch 28 of ram 26 will not be employed. The billet 2 is heated to selected temperature and is extruded to produce the extrusion 30 by applying sufficient pressure by the ram to the end of the billet. A selected reduction ration at a predetermined extrusion temperature and pressure is required to effect the necessary well bonded element with the thermoelectric material consolidated to a high density.

The extrusion ratio is the ratio of the cross-sectional area of the billet to the cross-sectional area of the extrusion 30. The throat 25 of die 24 must be of suitable diameter to provide the desired ratio. Both the metal of members 4 and 6 and the body 8 of thermoelectric material are reduced to a closely similar amount; each approaching the extrusion ratio.

Figure 3:
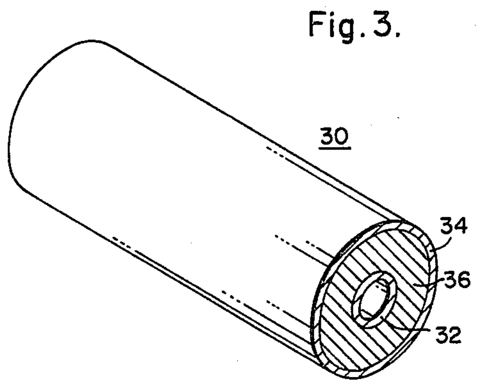
FIG. 3 is a perspective view of an extruded thermoelectric element with a hollow center.

Referring to FIG. 3, there is shown an extruded thermoelectric element 30, after the ends of the extrusion are removed consisting of an inner hollow cylindrical metal contact member 32 and an outer concentric cylindrical metal contact member 34 with a body 36 of highly consolidated thermoelectric material disposed therebetween and joined in firm and intimate contact with the metal walls of members 32 and 34. Surprisingly good bonding is effected between the metal and the body 30. The thermoelectric material body 36 may consist of any one of the p- or n-type materials such as those indicated in FIGS. 12 and 13, or two or more suitable layers in sequence, as for example, those mentioned in either of the latter two figures.

The metals used in forming the members 32 and 34 are selected on the basis of their compatibility with the thermoelectric material, desired electrical and temperature characteristics and resistance to corrosive atmospheres for a given application, as will be detailed more fully subsequently.

Figures 4, 5:
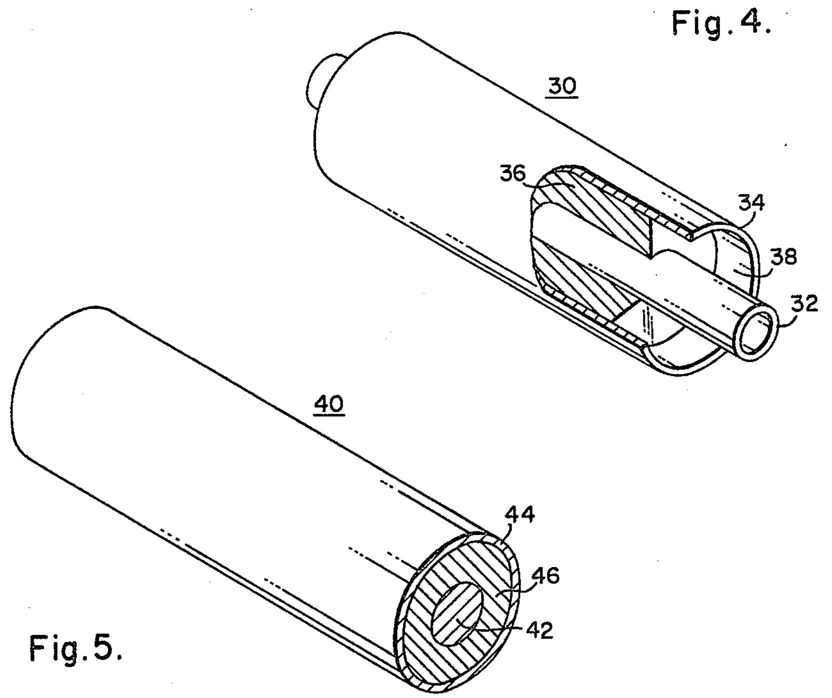
FIG. 4 is a perspective view partly in cross section of the machined thermoelectric element of FIG. 3.
FIG. 5 is a perspective view of an extruded thermoelectric element with a solid center.

When employing the extruded thermoelectric element 30 in an operational device, it is often desirable to connect two or more of either p- or n-type or alternate p-n type elements in a particular type of arrangement and circuitry. Referring to FIG. 4 there is shown the element 30 with a portion of the thermoelectric material 36 machined out of the end space between metal contact members 32 and 34 to provide for introducing coupling means to join it to another element. The other end of the element 30 is similarly treated. Each end of the outer cylindrical contact member 34 may then be cut back so that at each end the inner cylindrical contact member 32 projects beyond it. Thereafter coupling means with insulation may be soldered or brazed to either the member 32 or 34. The method of connecting the machined elements in a particular arrangement is the subject matter of copending application Serial No. 87,216, filed February 6, 1961, and now abandoned.

Referring to FIG. 5 there is shown a modified extruded thermoelectric element 40 wherein the inner cylindrical member 42 is a solid rod. The element comprises a concentric cylindrical metal contact member 44 with consolidated thermoelectric material 46 disposed between the two metal members and in firm and intimate contact with the walls of the same. The rod 42 may be suitably machined as by boring or etching to provide a hollow center in the element 40.

The hollow contact member 32 not only serves to carry electrical current, but enables a cooling fluid such as water or air to be conveyed to dissipate heat if it comprises the hot junction of a refrigerating device. If the element 30 is employed as a part of an electrical generator, hot gases, liquid or other heat source may be disposed or passed through the hollow contact member 32. The outer contact member 34 may cool a space or it may dissipate heat to a cold sink in either of these cases. The outer contact member 34 can function alternatively.

Figure 6:
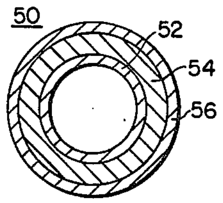
FIG. 6 is a cross sectional view of a cylindrical metal member composed of dissimilar metals.

Referring to FIG. 6 there is shown a cylindrical metal member 50 having concentrically bonded layers of dissimilar metals which may be required for special applications. The exposed layers 52 and 56 may consist of stainless steel or zirconium or base alloys thereof for highly corrosive atmospheres and the inner layer 54 may consist of a good electrically conductive metal, preferably copper or its alloys. The cylindrical member 50 may be used as the inner cylindrical member 4 of the billet 2, and thereby become the inner contact member 32 of thermoelectric element 30 or, it may be desirable that it be employed as the outer concentric cylindrical member 6 of the billet and thereby become the outer contact member 34 of the thermoelectric element. The metal layers 52 and 56 are provided to prevent reaction between certain thermoelectric materials with the good conductive metal during extrusion and to prevent corrosion during operation of the thermoelectric device made therefrom. Good results have been obtained when the layers 52 and 56 each were of the order of five mils in thickness of stainless steel or zirconium base alloy known as zircaloy, whereas the layer 54 was comprised of copper and was of the order of 30 mils in thickness, both thicknesses being after extrusion.

In certain cases it is desired to produce by extrusion flat surfaced or relatively flat faced, plate-like thermoelectric elements, particularly those comprising two or more thermoelectric materials in sequence. In some instances the different thermoelectric materials must be separated by a partition to prevent reaction between them during extrusion or use. The principles involved here are the subject matter of copending application Serial No. 83,987, filed January 23, 1961, and now abandoned.

Figure 7:
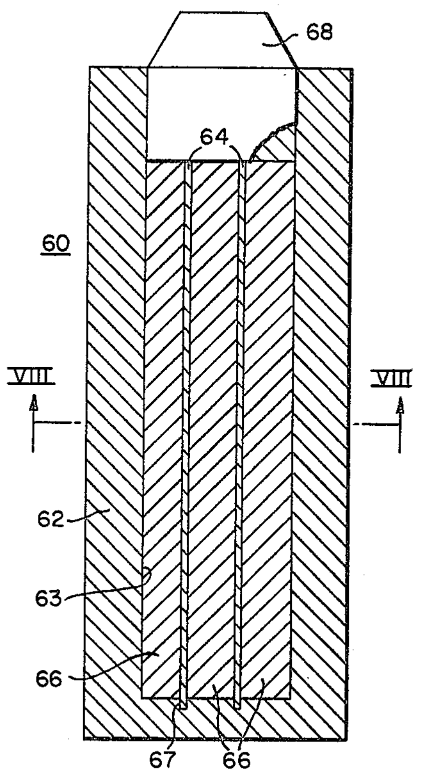
FIG. 7 is an elevational view in cross section of a compartmented cylindrical metal member filled with thermoelectric material prior to extrusion.
Figure 8:
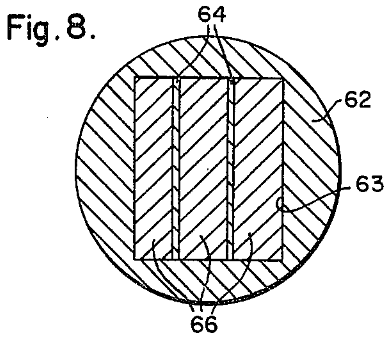
FIG. 8 is a plan view in cross section of the metal member of FIG. 8 on lines IX—IX.

Referring to FIGS. 7 and 8 there is shown a compartmented billet 60 suitable for preparing such thermoelectric plate elements. In this modification, a cylindrical outer metal casing 62 having a rectangular hollow space 63 is subdivided into several compartments. The desired compartment width ratio is provided by metal partitions 64, suitably located in the hollow space 63 prior to extrusion. The width of each compartment is designed for a certain thermal gradient which will be encountered by the final element in service. Thermoelectric materials 66 are placed in the billet space 63 and usually will be of a different composition for each compartment in order to operate at maximum efficiency in the different temperature zones in service. The same or similar thermoelectric material can be used at different levels or types of doping, one doping level in each compartment. The partitions 64 may be integral with the casing 62. Partitions of a different metal composition than casing 62 may, as plates, be fitted into grooves 67 in the lower end of the casing 62 as shown in FIG. 7. It should be observed that each thermoelectric material 66 in each compartment is isolated from the others.

After the thermoelectric materials are placed in the compartments and compressed, they are then outgassed and a nose cone 68 is sealed to the open end of the casing 62. The completed billet 60 is extruded in the manner indicated previously, except the extrusion is effected through a die having a flat rectangular orifice. Similarly other shapes such as elliptical and hexagonal shapes may be produced.

Figure 9:
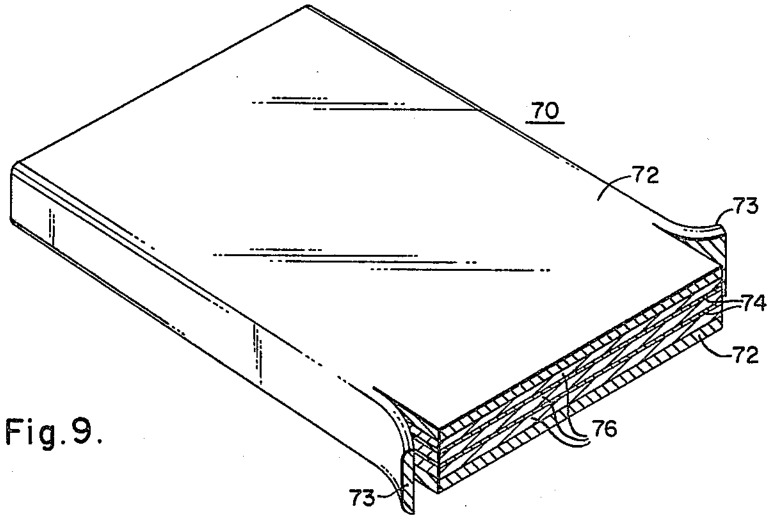
FIG. 9 is a perspective view partly in cross section of the member of FIG. 8 after extrusion.

With reference to FIG. 9, there is shown a thermoelectric element 70 after extrusion of the billet of FIG. 8 and removal of the extrusion ends. The element 70 consists of outer metal cladding 72, partitions 74 and thermoelectric material layers 76 disposed between the metal partitions and metal cladding and joined in firm and intimate contact with the metal surface thereof. The opposite edges 73 of the metal cladding 72 may then be removed by sawing or machining so that the layers of the thermoelectric material and the partitions are exposed on all sides. It should be understood that the thermoelectric materials 76 are arranged so that one flat face of the resulting element 70 can function as a hot junction and the other flat face a cold junction with maximum efficiency. The element 70 may then be severed laterally or diced into a plurality of elements or it may be employed as a single unit.

Figure 10:
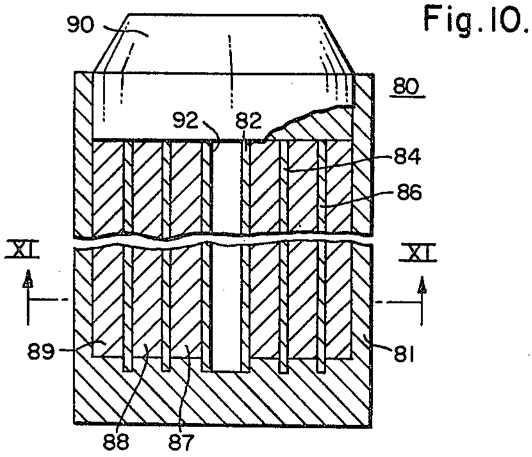
FIG. 10 is an elevation view partly in cross section of a plurality of concentric cylindrical members with thermoelectric material disposed between the members prior to extrusion.
Figure 11:
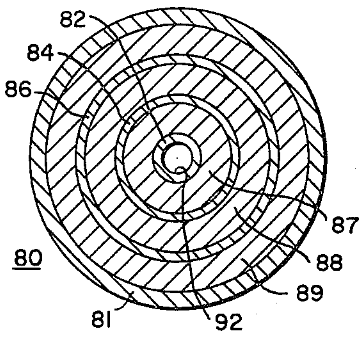
FIG. 11 is a plan view in cross section on lines XII—XII of the member of FIG. 10.

For a modification of the structure of FIGS. 1 and 2, reefrence should be had to FIGS. 10 and 11 showing a cylindrical annular compartmented billet 80 comprising a hollow outer casing 81 fitted with a plurality of cylindrical concentric partitions 82, 84 and 86 and layers 87, 88 and 89 of thermoelectric material disposed in the spaces between the partitions. This modification employs thermoelectric materials in a manner similar in principle to that indicated with respect to FIG. 7 in that the compositions of thermoelectric materials 88 can be varied to provide highest efficiency during operation over a certain thermal gradient. The partitions may be cast as a part of the original casing 81 or may be inserted thereafter. As indicated by the drawing, the inner cylindrical partition 82 has a hollow 92. However, an innermost solid rod may be employed and an inner bore may be machined in the solid rod after extrusion. After outgassing the billet is sealed with a cap 90 and extruded.

FIG. 11 is a cross section of the thermoelectric element 80 and is indicative of the general arrangement of the final extruded element. After extrusion, the thermoelectric material layers will be reduced in cross section into a solid compacted body and forced into a firm and intimate contact with the surfaces of the reduced thickness of metal walls of the billet. After extrusion, the thermoelectric element may be sectioned and the thermoelectric material and partitions are exposed.

In employing the selected thermoelectric materials and metal members, the extrusion temperatures for the production of the extruded thermoelectric elements must be correlated thereto in accordance with certain factors since the extrusion temperature is a function of the extrusion constant of both the metal cladding members and the thermoelectric material. However, it is preferred that the extrusion temperature does not approach closer than 100° F. to the melting point of any component of the billet. The extrusion constant "K" gives the force needed for extrusion of the particular material as a function of temperature. The extrusion constant "K" is defined as:

$$K=\frac{P}{A_0 \ln A_0/A_1}$$

where $P$=total pressure in pounds.
$A_0$=area of initial billet container, inches square.
$A_1$=area of extruded shape, inches square.
$K=f(T)$.

Referring now to Table I, there is shown K values for lead telluride, aluminum and copper.

TABLE I

*K values*

| Temp., ° F. | PbTe | Al | Cu |
|---|---|---|---|
| 1,000 | 11.5 | 4.5 | 15.3 |
| 800 | 11.5 | 5.5 | 19.4 |
| 600 | 14.6 | 7.5 | 22.0 |
| 400 | 15.7 | 10.5 | 25.0 |

Using this table and having given cross-sectional areas for copper or aluminum cladding and the lead telluride, the pressure for any given temperature can be calculated.

These K values also are useful for designing the billet to meet the desired final dimensions of the extruded element.

Figure 12:
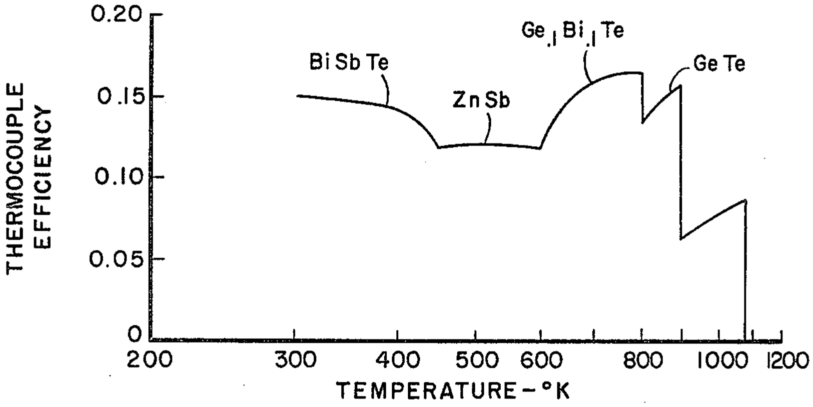
FIG. 12 is a graph of thermocouple efficiencies versus temperature for several p-type thermoelectric materials.
Figure 13:
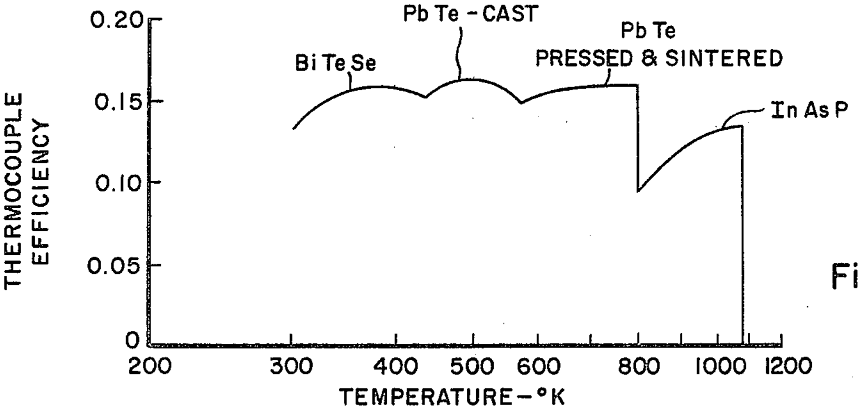
FIG. 13 is a graph of thermocouple efficiencies versus temperature for several n-type thermoelectric materials; and, FIG. 14 is a graph derived by plotting the electrical resistance versus extrusion temperature from the outer metal member to the inner metal member of an extruded thermoelectric lead telluride-aluminum element.

In preparing a thermoelectric material having the configuration shown in FIG. 3, reference should be made to FIGS. 12 and 13 to select a thermoelectric material having a good thermoelectric efficiency at a given operating temperature. For example, if lead telluride is chosen, reference is then made to Table I to determine what metal cladding materials would be most compatible with lead telluride at a given temperature based on the relative closeness of the K values of the materials. The closer the K values the more uniform the reduction in cross section of the billet. However, good extrusions are obtainable with the substantial differences in K factor.

The following examples are illustrative of the teachings of the invention.

*Example I*

An aluminum cylinder 6 inches long and 3 inches in diameter, of a wall thickness of 0.25 inch was fitted with a conical nose and a central aluminum tube of .305 inch inner diameter and a wall thickness of 0.12 inch; the inner annular space was filled with powdered lead telluride and compacted therein at a pressure of 1000 p.s.i. An end plug with an outgassing hole was welded to the rear end of the aluminum cylinder. The assembly was heated to a temperature of from 600 to 800° F. for 20 hours and evacuated to less than 1 micron pressure. The outgassing hole was then sealed.

The resulting billet was heated to about 1000° F. and extruded using a press as shown in FIG. 2, to effect a reduction ratio of 60 to 1. Satisfactory thermoelectric elements were produced.

*Example II*

Figure 14:
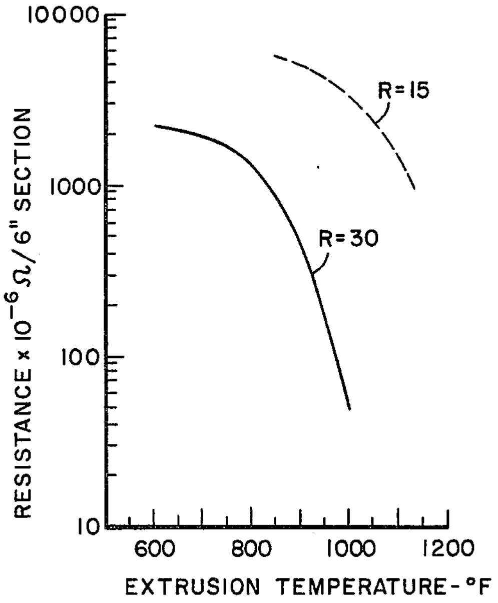

Four billets were prepared in the manner of Example I and three were extruded, one each at temperatures of 600° F., 800° F. and 1,000° F., respectively, at a reduction ratio of 30 to 1, and the last billet was extruded at 1,000° F. at a reduction ratio of 15 to 1, to produce hollow center extruded elements. The curves of FIG. 14 show the effect of the extrusion variables, temperature and reduction ratio ($R=A_0/A_1$), on the electrical resistance of the resulting extruded element. The improvement in electrical conductivity with increasing extrusion temperature and increasing reduction ratio is very noticeable.

From examination of the cross-sections of the extruded elements, it was apparent that improved contact between the lead telluride and the aluminum cladding material was obtained at the higher temperatures and higher reduction ratios.

*Example III*

A billet was prepared of the same size and shape as in Example I. The inner annular space was filled with germanium bismuth telluride and was compacted and outgassed in the same manner as in Example I. The billet was heated and extruded at approximately 1,000° F. to effect a reduction ratio of 30 to 1. Satisfactory thermoelectric elements with metal contacts bonded to the thermoelectric material were obtained upon sectioning of the extruded member.

*Example IV*

A billet was prepared of the same size and shape as in Example I wherein the cylinder and central tube were composed of zircaloy. The inner annular space was filled with powdered lead telluride which was compacted therein at a pressure of 1,000 p.s.i. The billet was sealed as in Example I and outgassed at a temperature of from 800° F. to 1,400 ° F. for 24 hours and evacuated to less than 1 micron pressure. The outgassing hole was then sealed. The resulting billet was heated and extruded at approximately 1,100° F. to effect a reduction ratio of 45 to 1. Satisfactory thermoelectric elements were obtained. The zircaloy had the composition set forth in Patent 2,772,964.

*Example V*

A billet was prepared of the same size and shape as in Example I. The metal cylinder and inner tube were composed of a high purity iron, known as Armco iron, and lead telluride thermoelectric material was disposed therein. The billet was compacted in the same manner and under the same conditions as in Example I. The resulting billet was extruded at approximately 1100° F. to effect a reduction ratio of 30 to 1. Satisfactory thermoelectric elements were obtained.

Similarly, other thermoelectric elements may be prepared and extruded as described by substituting copper for aluminum with slight modifications in preparing the initial billet to compensate for the different metal and design considerations. Also, it is desirable in thermoelectric elements comprising different thermoelectric materials to prevent reaction or diffusion of any component from one thermoelectric composition to another. In these cases, the partition may consist of one or more of the metals iron, cobalt, chromium, molybdenum, silicon, zirconium and titanium, or surface coatings of one or more of these metals may be applied on the before mentioned partition metal members. Any thermoelectric material may be used in preparing the extruded thermoelectric elements along with any suitable and compatible cladding metal by correlating the extrusion variables. It should be understood, of course, that the thermoelectric material and the metal used should not be heated to their melting temperatures and in no event should the extrusion temperature approach closer than 100° F. to the melting point of any material used in the billet.

While the invention has been described with reference to particular embodiments and examples, it will be understood, of course, that modifications, substitutions and the like may be made therein without departing from its scope.

I claim as my invention:

1. An extruded thermoelectric element comprising a highly consolidated dense body of a telluride thermoelectric material and metal members metallurgically joined thereto by coextrusion therewith so that the metal members are in firm and intimate contact with the surfaces of the body of the thermoelectric material to provide good electrical contact therewith, the metal being selected from at least one of the group consisting of aluminum, copper, iron, and zirconium base alloys.

2. The thermoelectric element of claim 1 wherein the metal members comprise aluminum.

3. The thermoelectric element of claim 1 wherein the metal members comprise zirconium.

4. The thermoelectric element of claim 1 wherein the metal members comprise Armco iron.

5. The thermoelectric element of claim 1 wherein the thermoelectric material is lead telluride.

6. The thermoelectric element of claim 1 wherein the thermoelectric material is germanium bismuth telluride.

7. The thermoelectric element of claim 1 wherein the metal members comprise copper.

8. An extruded thermoelectric element comprising at least two concentric cylindrical metal members, the metal being selected from at least one of the group consisting of aluminum, copper, iron, and zirconium base alloys, and a highly consolidated body of a telluride thermoelectric material disposed therebetween and joined in firm and intimate contact with the metal walls of the members so that the metal members provide electrical contacts to the thermoelectric material.

9. An extruded thermoelectric element comprising a metal rod member and a concentric cylindrical metal member, the metal being selected from at least one of the group consisting of aluminum, copper, iron, and zirconium base alloys, and a highly consolidated body of a telluride thermoelectric material disposed therebetween and joined in firm and intimate contact with the metal walls of the members so that the metal members provide electrical contacts to the thermoelectric material.

10. An extruded thermoelectric element comprising at least two concentric cylindrical metal members, the metal being selected from at least one of the group consisting of aluminum, copper, iron, and zirconium base alloys, one of the members consisting of at least two concentrically bonded dissimilar metals and a highly consolidated body of a telluride thermoelectric material disposed therebetween and joined in firm and intimate contact with the metal walls of the members so that the metal members provide electrical contacts to the thermoelectric material.

11. An extruded thermoelectric element comprising a highly consolidated dense body of a telluride thermoelectric material comprising at least two thermoelectric composition portions joined to metal partitions separating the portions and metal members mechanically joined to the outer surfaces of the body, the metal being selected from at least one of the group consisting of aluminum, copper, iron, and zirconium base alloys, all being joined by coextrusion so that the metal parts are in firm and intimate contact with the surfaces of the body of thermoelectric material to provide good electrical contact therewith.

12. An extruded thermoelectric element comprising concentric cylindrical metal members, the metal being selected from at least one of the group consisting of aluminum, copper, iron, and zirconium base alloys, the members delineating a plurality of compartments and a highly consolidated body of a telluride thermoelectric material disposed in and filling the compartments, the material in one compartment being of a different composition than that disposed in an adjacent compartment, the material being joined in firm and intimate contact with the metal walls of the compartments so that the metal walls provide electrical contacts to the thermoelectric material.

References Cited by the Examiner

UNITED STATES PATENTS

| | | | |
|---|---|---|---|
| 791,096 | 1/1904 | Hoopes | 29—193 |
| 2,289,152 | 7/1942 | Telkes | 136—5 |
| 2,358,892 | 9/1944 | Upton | 207—10.3 |
| 2,543,331 | 2/1951 | Okolicsanyi | 136—5.5 |
| 2,626,970 | 1/1953 | Hunrath | 136—4.2 |
| 2,805,272 | 9/1957 | Postal | 136—4 |
| 2,836,884 | 6/1958 | Graham | 29—423 |
| 3,018,312 | 1/1962 | Cornish et al. | 136—5 |
| 3,051,767 | 8/1962 | Fredrick et al. | 136—5 |
| 3,065,286 | 11/1962 | Connel | 136—4 |
| 3,066,403 | 12/1962 | Brauchler | 29—191.2 |

FOREIGN PATENTS

| | | |
|---|---|---|
| 874,660 | 8/1961 | Great Britain. |

OTHER REFERENCES

Danko et al., "Thermoelectric Nuclear Fuel Element. Annular Progress Report, April 15, 1959." WCAP–1162. Pp. 5, 6, 43–49 and 65–69.

N. R. Gardner, "Coextruded Parts Can Simplify Design," in Materials in Design Engineering, vol. 48, No. 7, December 1958. Pp. 91–3.

A. N. Holden, "Physical Metallurgy of Uranium," pages 161, 208, 209, 211, Addison-Wesley Publishing Co., Inc., Reading, Mass., 1958.

WINSTON A. DOUGLAS, *Primary Examiner.*

WILLIAM STEPHENSON, JOSEPH REBOLD, *Examiners.*

A. L. LEAVITT, J. BARNEY, A. M. BEKELMAN, *Assistant Examiners.*